(12) United States Patent
Lee et al.

(10) Patent No.: US 10,468,546 B2
(45) Date of Patent: Nov. 5, 2019

(54) SOLAR CELL MODULE AND METHOD FOR MANUFACTURING THE SAME

(71) Applicant: GWANGJU INSTITUTE OF SCIENCE AND TECHNOLOGY, Gwangju (KR)

(72) Inventors: Kwang Hee Lee, Gwangju (KR); Hong Kyu Kang, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 420 days.

(21) Appl. No.: 14/784,578

(22) PCT Filed: Dec. 27, 2013

(86) PCT No.: PCT/KR2013/012267
§ 371 (c)(1),
(2) Date: Dec. 15, 2015

(87) PCT Pub. No.: WO2014/171615
PCT Pub. Date: Oct. 23, 2014

(65) Prior Publication Data
US 2016/0118522 A1    Apr. 28, 2016

(30) Foreign Application Priority Data
Apr. 15, 2013    (KR) .................... 10-2013-0040876

(51) Int. Cl.
*H01L 31/05*    (2014.01)
*H01L 31/0465*    (2014.01)
(Continued)

(52) U.S. Cl.
CPC ....... *H01L 31/0508* (2013.01); *H01G 9/2081* (2013.01); *H01L 31/046* (2014.12);
(Continued)

(58) Field of Classification Search
None
See application file for complete search history.

(56) References Cited

U.S. PATENT DOCUMENTS 3,483,038 A  * 12/1969  Hui et al. ........ H01L 31/022425
                                                       136/244
4,517,403 A  *  5/1985  Morel ............. H01L 31/022425
                                                       136/258
(Continued)

FOREIGN PATENT DOCUMENTS

CN    101232058 A    7/2008
CN    101842934 A    9/2010
(Continued)

OTHER PUBLICATIONS

Chinese Office Action dated Apr. 1, 2017 in connection with the counterpart Chinese Patent Application No. 201380075678.X.
(Continued)

*Primary Examiner* — Tamir Ayad
(74) *Attorney, Agent, or Firm* — Hauptman Ham, LLP

(57) ABSTRACT

Disclosed herein are a solar cell module and a method for manufacturing the same. The solar cell module comprises: a substrate; and a plurality of solar cells located on the substrate, each solar cell comprising a first electrode, a second electrode, and a photoactive layer located between the first electrode and the second electrode, wherein at least a portion of a second electrode is located on a photoactive layer of a neighboring solar cell, and a conductive channel is located between the second electrode and a first electrode of the neighboring solar cell. Therefore, a solar cell module having a structure in which every layer except for electrodes is entirely formed as a thin film may be provided. In addition, a solar cell module the module efficiency of which is improved by increasing the active area of each solar cell may be provided.

11 Claims, 7 Drawing Sheets

(51) Int. Cl.
  *H01L 31/046* (2014.01)
  *H01L 31/0475* (2014.01)
  *H01G 9/20* (2006.01)
  *H01L 31/072* (2012.01)

(52) U.S. Cl.
  CPC ...... *H01L 31/0465* (2014.12); *H01L 31/0475* (2014.12); *H01L 31/072* (2013.01); *H01G 9/2031* (2013.01); *H01G 9/2059* (2013.01); *Y02E 10/542* (2013.01); *Y02P 70/521* (2015.11)

(56) References Cited

U.S. PATENT DOCUMENTS

| | | | | |
|---|---|---|---|---|
| 2005/0263178 | A1* | 12/2005 | Montello | H01G 9/2027 136/244 |
| 2008/0178924 | A1* | 7/2008 | Kempa | B82Y 10/00 136/244 |
| 2008/0230112 | A1* | 9/2008 | Barnham | H01L 31/061 136/249 |
| 2010/0065099 | A1 | 3/2010 | Tandon et al. | |
| 2010/0236607 | A1 | 9/2010 | Korevaar et al. | |
| 2012/0279549 | A1* | 11/2012 | Urien | H01L 27/301 136/244 |
| 2013/0112254 | A1* | 5/2013 | Lorenzetti | H01L 31/03529 136/255 |

FOREIGN PATENT DOCUMENTS

| | | |
|---|---|---|
| JP | 2007317868 A | 12/2007 |
| JP | 4975528 B2 | 7/2012 |
| KR | 1020080107470 A | 12/2008 |
| KR | 1020120001045 A | 1/2012 |
| KR | 1020130011598 A | 1/2013 |
| KR | 1020130033803 A | 4/2013 |
| WO | 2012106360 A1 | 8/2012 |

OTHER PUBLICATIONS

International Search Report for PCT/KR2013/012267 dated Mar. 14, 2014.

* cited by examiner

SOLAR CELL MODULE AND METHOD FOR MANUFACTURING THE SAME

TECHNICAL FIELD

The present disclosure relates to a solar cell module and a method for manufacturing the same. More specifically, the present disclosure relates to a solar cell module having an improved performance and a structure in which individual solar cells are serially connected by forming a conductive channel between counter electrodes which are respectively present in separate solar cells constituting the solar cell module, and a method for manufacturing the same.

BACKGROUND ART

As the unit device (or cell) efficiency of an organic solar cell has been increased so that it is now commercially available, researches into an organic solar cell module in which solar cells are continuously connected are actively proceeding.

In particular, since an organic solar cell allows for utilization of a solution of an organic material, studies for introducing a printing process into the manufacture of an organic solar cell module to produce a low-cost organic solar cell module are attracting attentions.

The most widely used conventional organic solar cell module has the form where a patterned first electrode, a patterned first charge transport layer (hole transport layer or electron transport layer), a patterned photoactive layer, a patterned second charge transport layer (electron transport layer or hole transport layer) and a patterned second electrode are sequentially stacked on a substrate in this order.

In the conventional organic solar cell module, thin films should be formed by slightly shifting each layer to continuously connect counter electrodes each of which is in a different solar cell. In doing so, if counter electrodes in one solar cell contact with each other, it is no longer operate as a module.

Therefore, in the conventional organic solar cell module, the first charge transport layer, the photoactive layer and the second charge transport layer, as well as the first electrode and the second electrode, should be patterned, which means that a first electrode of a first organic solar cell directly contacts with a second electrode of a second organic solar cell without the hindrance of any other layer.

However, in the manufacture of the conventional organic solar cell module, since thin films should be patterned with slight and gradual shift of each layer, an advanced patterning technique is required to align thin films so as to obtain thus-patterned thin films, resulting in the difficulties in manufacturing an organic solar cell module and, consequently, the increase of the price of an organic solar cell module.

Further, as the number of such patterning processes increases, the active area (the area where an electric energy may be actually generated), i.e., the part where a first electrode and a second electrode of each solar cell are overlapped with each other, decreases, and the inactive area, i.e., the part where electrodes are not overlapped with each other, increases at the same time.

Thus, there is a problem that the dead zone (the area where an electric energy may not be actually generated) increases in the total solar cell area, resulting in the reduced efficiency of the solar cell module.

DISCLOSURE

Technical Problem

An object of the present disclosure is to provide a solar cell module that does not require sophisticated patterning technique for the alignment of thin films.

Another object of the present disclosure is to provide a solar cell module with improved efficiency by increasing the active area of each solar cell.

Another object of the present disclosure is to provide a method for manufacturing the solar cell module.

Technical Solution

One aspect of the present disclosure to solve the problem provides a solar cell module. The solar cell module may include a substrate; and a plurality of solar cells located on the substrate, each solar cell including a first electrode, a second electrode, and a photoactive layer located between the first electrode and the second electrode. At least a portion of a second electrode is located on a photoactive layer of a neighboring solar cell, and a conductive channel is located between the second electrode and a first electrode of the neighboring solar cell.

The conductive channel may be located in a layer between the second electrode and the first electrode of the solar cell.

Further, nanostructures may be further included in the photoactive layer to induce the efficient formation of the conductive channel.

Another aspect of the present disclosure to solve the problem provides a method for manufacturing a solar cell module.

The method for manufacturing a solar cell module may include the steps of forming a plurality of first electrodes, disposed apart from each other, on a substrate; forming a photoactive layer entirely over the substrate on which the first electrodes are formed; forming a plurality of solar cells by forming a plurality of second electrodes, disposed apart from each other, on the photoactive layer, wherein at least a portion of a second electrode is located on a photoactive layer of a neighboring solar cell; and forming a conductive channel by applying an electric field across the second electrode and a first electrode of the neighboring solar cell.

Advantageous Effects

According to the present disclosure, a solar cell module having a structure in which every layer except for electrodes is entirely formed as a thin film may be provided.

Therefore, a solar cell module the module efficiency of which is improved by decreasing the inactive area required for a patterning process and increasing the active area of each solar cell may be provided.

In addition, a method for manufacturing a solar cell module in which an advanced patterning technique for the alignment of thin films is not required may be provided.

Technical effects of the present disclosure are not limited to those mentioned above, other technical effects will be explicitly understood from the following description by those skilled in the art to which the present disclosure pertains.

BEST MODE

Figure 1:
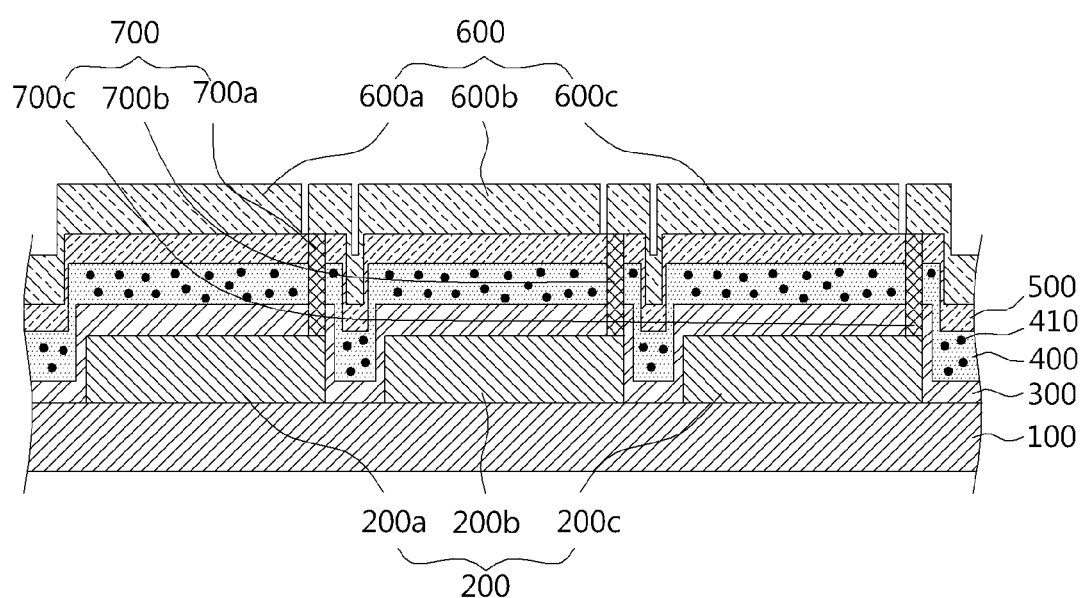
FIG. 1 is a cross-sectional view showing the solar cell module according to one embodiment of the present disclosure.

Hereinafter, exemplary embodiments of the present disclosure will be described in detail with reference to the accompanying drawings.

While the present disclosure is susceptible to various modifications and alternative forms, specific embodiments thereof are shown by way of example in the drawings and will herein be described in detail. It should be understood, however, that the drawings and detailed description thereto are not intended to limit the present disclosure to the particular form disclosed, but on the contrary, it is intended to cover all modifications, equivalents, and alternatives falling within the spirit and scope of the present disclosure as defined by the appended claims.

It is to be understood that, when one element such as a layer, an area or a substrate is referred to as being "on" another element, the one element may be present directly on the another element, or any intermediate element may be present between the one element and the another element.

The terms "first," "second," and the like may be used for distinguishing between similar elements, components, areas, layers and/or regions, but it is to be understood that the elements, components, areas, layers and/or regions are not limited by the terms.

FIG. 1 is a cross-sectional view of the solar cell module according to one embodiment of the present disclosure.

Referring to FIG. 1, the solar cell module includes a substrate 100; and a plurality of solar cells located on the substrate 100, each solar cell including a first electrode 200, a second electrode 600 and a photoactive layer 400 located between the first electrode 200 and the second electrode 600.

Here, at least a portion of a second electrode 600 is located on a photoactive layer 400 of a neighboring solar cell, and a conductive channel 700 is located between the second electrode 600 and a first electrode 200 of the neighboring solar cell.

On the other hand, individual solar cells are distinguished, based on the area of a first electrode. Also, the area where a first electrode and a second electrode of each solar cell are overlapped with each other is defined as active area, and the area where a first electrode of a solar cell of interest and a second electrode of a neighboring solar cell are overlapped with each other is defined as connective area.

In addition, the remaining area in the overall solar cell module, other than the active area of each solar cell, is defined as inactive area.

Meanwhile, a first charge transport layer 300 located between the first electrode 200 and the photoactive layer 400 may be further included. In addition, a second charge transport layer 500 located between the photoactive layer 400 and the second electrode 600 may be further included.

However, the first charge transport layer 300 or the second charge transport layer 500 may be omitted, if desired.

The substrate 100 may be a transparent inorganic substrate selected from a glass, a quartz, $Al_2O_3$, SiC, and the like, or a transparent organic substrate selected from PET (polyethylene terephthalate), PES (polyethersulfone), PS (polystyrene), PC (polycarbonate), PI (polyimide), PEN (polyethylene naphthalate), PAR (polyarylate), and the like.

A plurality of first electrodes 200 is located on the substrate 100. At this time, a plurality of the first electrodes 200 may be disposed apart from each other on the substrate 100.

The first electrodes 200 may serve as a cathode or an anode, depending on the kind of the charge transport layer 300 disposed on the first electrodes 200.

For example, when a hole transport layer is disposed as a charge transport layer 300 on the first electrodes 200, the first electrodes 200 serve as an anode for collecting holes generated from the photoactive layer 400.

In addition, an electron transport layer is disposed as a charge transport layer 300 on the first electrodes 200, the first electrodes 200 may serve as a cathode for collecting electrons generated from the photoactive layer 400.

The first electrodes 200 are preferably a material having a transparency to transmit a light. For example, the first electrodes 200 may consist of carbon nanotubes (CNT), carbon allotropes such as graphene, etc., ITO, or a transparent conductive oxide (TCO) such as a doped ZnO, MgO, etc.

Further, a conductive polymer material, such as polyacetylene, polyaniline, polythiophene, polypyrrole, etc., can be used, and a metal grid wiring obtained by depositing or printing with an ink may be added for improving the conductivity of the material.

The first charge transport layer 300 is located on the first electrodes 200. The first charge transport layer 300 may be located entirely over the substrate 100 on which a plurality of the first electrodes 200 are located. In other words, the first charge transport layer 300 does not require a patterning process for serial connection between individual solar cells, unlike in the prior art.

The first charge transport layer 300 serves to capture electrons or holes separated from the photoactive layer 400 and to transport to the first electrodes 200.

The first charge transport layer 300 may be a hole transport layer or an electron transport layer.

In case the first charge transport layer 300 is a hole transport layer, the hole transport layer may be PEDOT:PSS (poly(3,4-ethylenedioxythiophene):poly(styrenesulfonate)), polythiophenylenevinylene, polyvinylcarbazole, poly-p-phenylenevinylene, and derivatives thereof. However, without being limited thereto, various types of organic materials capable of increasing the work function of the first electrodes 200 in contact with the hole transport layer can be used. In addition, a p-type doped metal oxide semiconductor, such as molybdenum oxide, vanadium oxide, tungsten oxide, or the like, may be used.

If the first charge transport layer 300 is an electron transport layer, the electron transport layer may be fullerene (C60, C70, C80) or a fullerene derivative PCBM ([6,6]-phenyl-C61 butyric acid methyl ester) (PCBM (C60), PCBM (C70), PCBM (C80)). However, without being limited thereto, various types of organic materials capable of decreasing the work function of the first electrodes 200 in contact with the electron transport layer may be used. In addition, an n-type doped metal oxide semiconductor, such as titanium oxide ($TiO_x$), zinc oxide (ZnO), or the like, may be used.

The photoactive layer 400 is located on the first charge transport layer 300. The photoactive layer 400 may be located entirely over the first charge transport layer 300. That is, the photoactive layer 400 of the present disclosure does not require a patterning process for a serial connection between individual solar cells, unlike in the prior art. On the other hand, when the first charge transport layer 300 is omitted, the photoactive layer 400 will be located entirely over the substrate 100 on which a plurality of the first electrodes 200 is located.

The photoactive layer 400 serves to absorb a light irradiated on the solar cell to form an electron-hole pair in an excited state, that is, an exciton.

The photoactive layer 400 may be a bulk heterojunction structure or a bilayer structure of electron donor materials and electron acceptor materials.

The electron donor material may include an organic material absorbing a light. For example, the electron donor material may be a conjugated polymer including poly-3-hexylthiophene (P3HT), poly-3-octylthiophene (P3OT), poly-p-phenylenevinylene (PPV), poly(9,9'-dioctylfluorene), poly(2-methoxy-5-(2-ethyl-hexyloxy))-1,4-phenylenevinylene (MEH-PPV), poly(2-methyl-5-(3',7'-dimethyloctyloxy)-1,4-phenylenevinylene (MDMO-PPV), and the like, and modifications thereof, or an organic small molecule including CuPc, ZnPc, and the like.

In addition, the electron acceptor material may be an organic material including fullerene (C60, C70, C80) or a fullerene derivative PCBM ([6,6]-phenyl-C61 butyric acid methyl ester) (PCBM (C60), PCBM (C70), PCBM (C80)), carbon nanotubes or graphene, or an inorganic material including a metal oxide, such as ZnO, $TiO_2$, $SnO_2$, or the like. However, without being limited thereto, various materials capable of receiving electrons from a photoactivated electron donor material may be used.

Nanostructures 410 may be further included in the photoactive layer 400. The nanostructures 410 may include metal nanoparticles, metal nanowires, CNTs or graphene. For example, the photoactive layer 400 may further include silver nanoparticles.

The nanostructures 410 serve to induce the efficient formation of a conductive channel 700 between a second electrode 600 and a first electrode 300 of a neighboring solar cell.

For example, the conductive channel 700 may be formed between counter electrodes each of which is in a separate neighboring solar cell by applying an electric field via connection of the counter electrodes each of which is in the separate neighboring solar cell. Here, by further incorporating nanostructures 410 into the photoactive layer 400 located between the counter electrodes each of which is in the separate neighboring solar cell, the more efficient formation of the conductive channel 700 may be induced.

Further, the nanostructures 410 may minimize the problem of device destruction phenomenon which may occur at the time of applying a strong electric field in order to form the conductive channel 700.

A second charge transport layer 500 is located on the photoactive layer 400. The second charge transport layer 500 may be located entirely over the photoactive layer 400. That is, the second charge transport layer 500 does not require a patterning process for serial connection of individual solar cells, unlike in the prior art.

The second charge transport layer 500 serves to capture electrons or holes separated from the photoactive layer 400 and to transport the captured electrons or holes to the second electrodes 600.

The second charge transport layer 500 may be a hole transport layer or an electron transport layer. Here, the hole transport layer or the electron transport layer may be the same material as the hole transport layer or the electron transport layer of the first charge transporting layer 300 as described above.

A plurality of the second electrodes 600 is located on the second charge transport layer 500. Here, a plurality of the second electrodes 600 may be disposed apart from each other on the second charge transport layer 500.

Accordingly, a plurality of solar cells including first electrodes 200a, 200b and 200c, second electrodes 600a, 600b and 600c, and a first charge transport layer 300, a photoactive layer 400 and a second charge transport layer 500, which are located between the first electrodes 200a, 200b and 200c and the second electrodes 600a, 600b and 600c, may be formed.

On the other hand, at least a portion of a second electrode 600 may be located on a second charge transport layer 500 of a neighboring solar cell. For example, a portion of a second electrode 600b may be located on a second charge transport layer 500 of a solar cell of interest, and another portion thereof may be located on a second charge transport layer 500 of a neighboring solar cell.

Consequently, this means that the part where at least a portion of a second electrode 600b is overlapping with a first electrode 200a of a neighboring solar cell is formed.

The part where a second electrode 600 is overlapping with a first electrode 200 of a neighboring solar cell is formed, and, thereby, a conductive channel 700 may be formed between the second electrode 600 and the first electrode 200 of the neighboring solar cell through an electrical work-up for the second electrode 600 and the first electrode 200 of the neighboring solar cell.

On the other hand, when the second charge transport layer 500 is omitted, at least a portion of a second electrode 600 may be located on the photoactive layer 400 of the neighboring solar cell.

The second electrode 600 may serve as a cathode or an anode depending on the kind of the second charge transport layer 500.

For example, if the second charge transport layer 500 is a hole transport layer, the second electrode 600 may serve as an anode for collecting holes generated form the photoactive layer, and if the second charge transport layer 500 is an electron transport layer, the second electrode 600 may serve as a cathode for collecting electrons generated from the photoactive layer.

The second electrode 600 may be a metal electrode of any one selected from Al, Au, Cu, Pt, Ag, W, Ni, Zn and Ti, and alloys thereof. In addition, a conductive polymer material, such as polyacetylene, polyaniline, polythiophene, polypyrrole, and the like, may be used.

The first electrode 200 and the second electrode 600, as mentioned above, may also be used in reverse. For example, a metal electrode may be disposed as a first electrode 200. Here, when a conductive film having a transparency is disposed as a second electrode 600, it may operate as a solar cell which receives a light at the top thereof.

The conductive channel 700 is located between the second electrode 600 and the first electrode 200 of the neighboring solar cell. Thus, the conductive channel 700 electrically connects the second electrode 600 and the first electrode 200 of the neighboring solar cell.

At this time, the conductive channel may be located in a layer between the second electrode 600 and the first electrode 200 of the neighboring solar cell.

For example, as shown in FIG. 1, a conductive channel 700a may be located in a layer between a second electrode 600b and a first electrode 200a of a neighboring solar cell. That is, a conductive channel 700 may be formed through the layer between the second electrode 600 and the first electrode 200 of the neighboring solar cell.

For example, if a first charge transport layer 300, a photoactive layer 400 and a second charge transport layer 500 are sequentially located between the second electrode 600 and the first electrode 200 of the neighboring solar cell, a conductive channel 700 may be located through the first charge transport layer 300, the photoactive layer 400 and the second charge transport layer 500. However, without being limited thereto, a conductive channel 700 may be formed only in the photoactive layer 400.

As another example, a photoactive layer 400 is located between the second electrode 600 and the first electrode 200 of the neighboring solar cell, a conductive channel 700 may be located in the photoactive layer 400.

Figure 2:
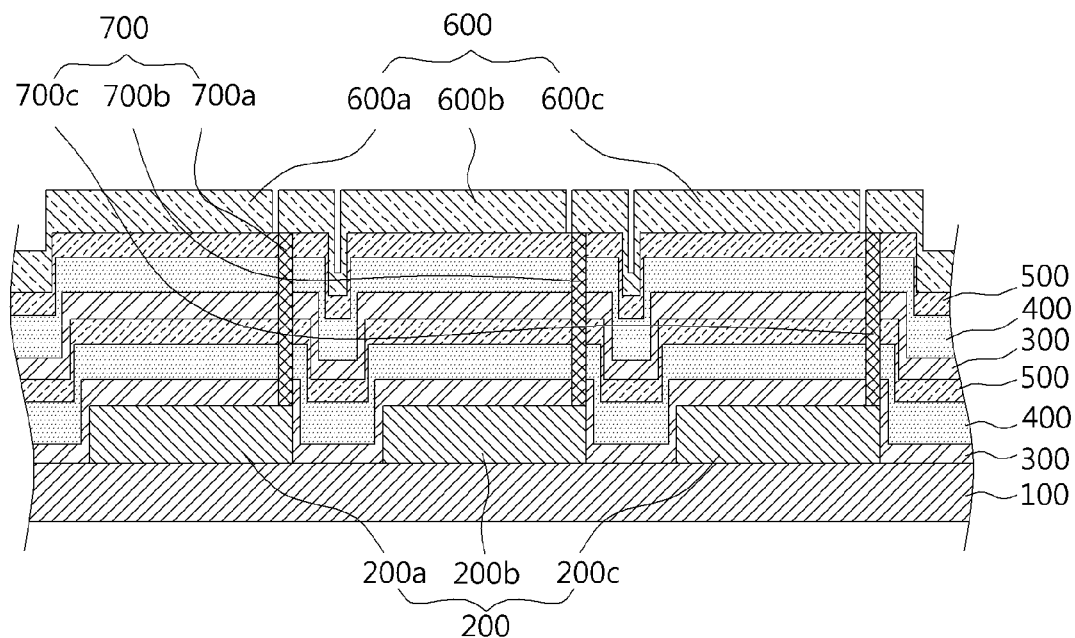
FIG. 2 is a cross-sectional view showing the solar cell module according to another embodiment of the present disclosure.

FIG. 2 is a cross-sectional view showing the solar cell module according to another embodiment of the present disclosure.

Referring to FIG. 2, the solar cell module according to one embodiment of the present disclosure may include a stacked solar cell on which a substrate 100 and a plurality of photoactive layers 400 are layered.

The solar cell is identical to that illustrated in FIG. 1, except that a first charge transport layer 300, a photoactive layer 400 and a second charge transport layer 500 are repeatedly stacked in a plurality of times.

Since the present disclosure discloses a structure in which every layer except for electrodes is not patterned and is entirely formed as a thin film, when applying to a stacked solar cell in this way, the improvement of module efficiency may be further maximized.

Figure 3:
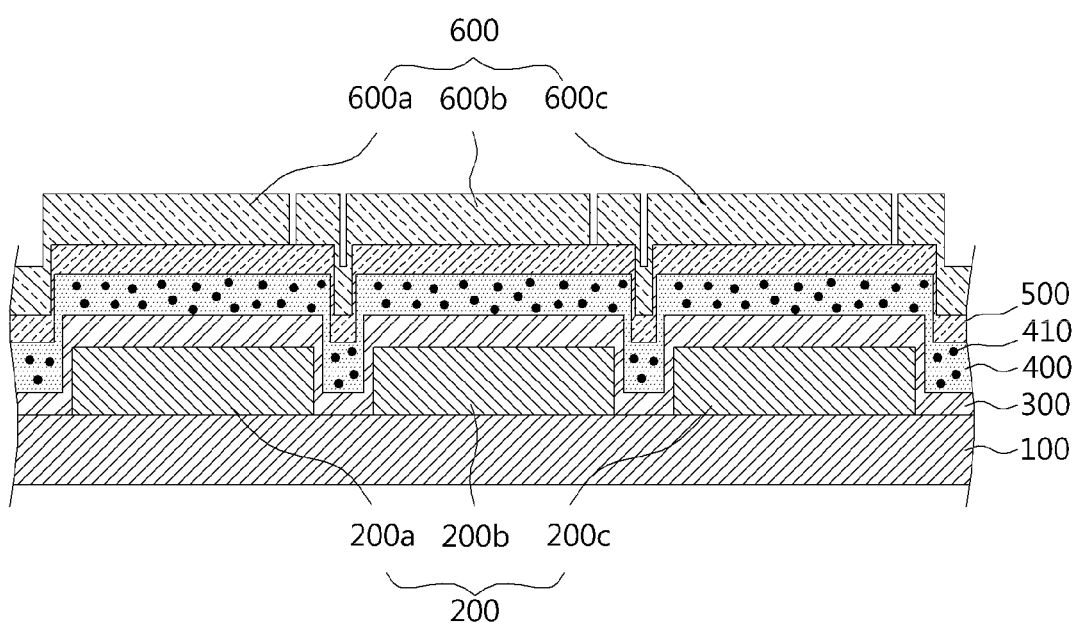
FIGS. 3 to 5 are cross-sectional views showing the method for manufacturing the solar cell module according to one embodiment of the present disclosure, in accordance with process steps.
Figure 4:
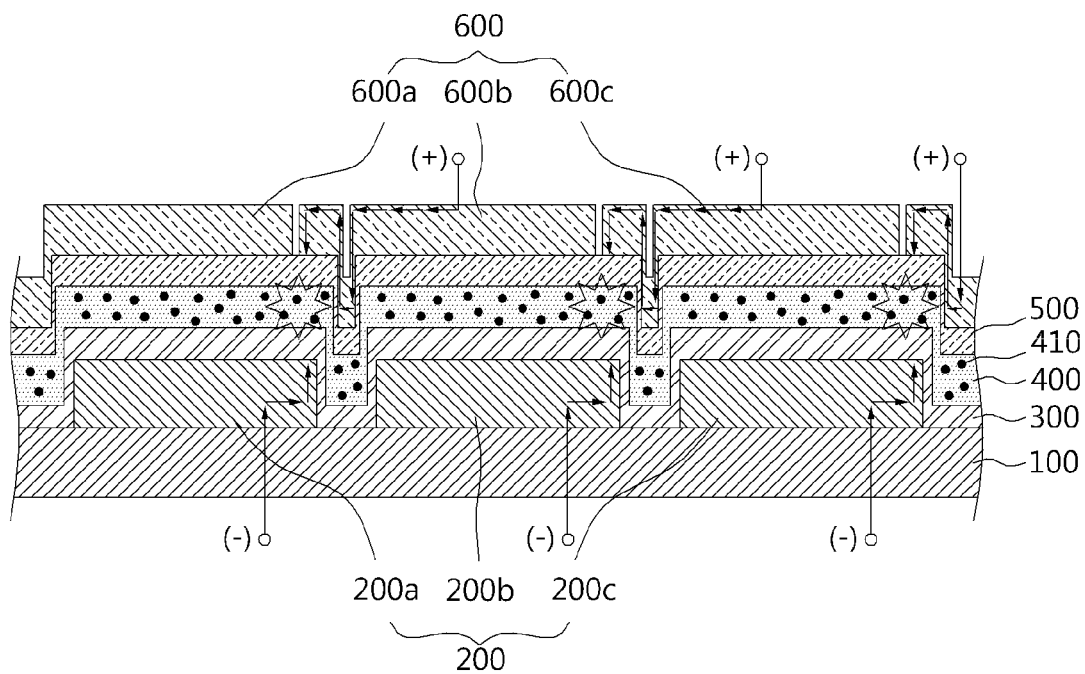
Figure 5:
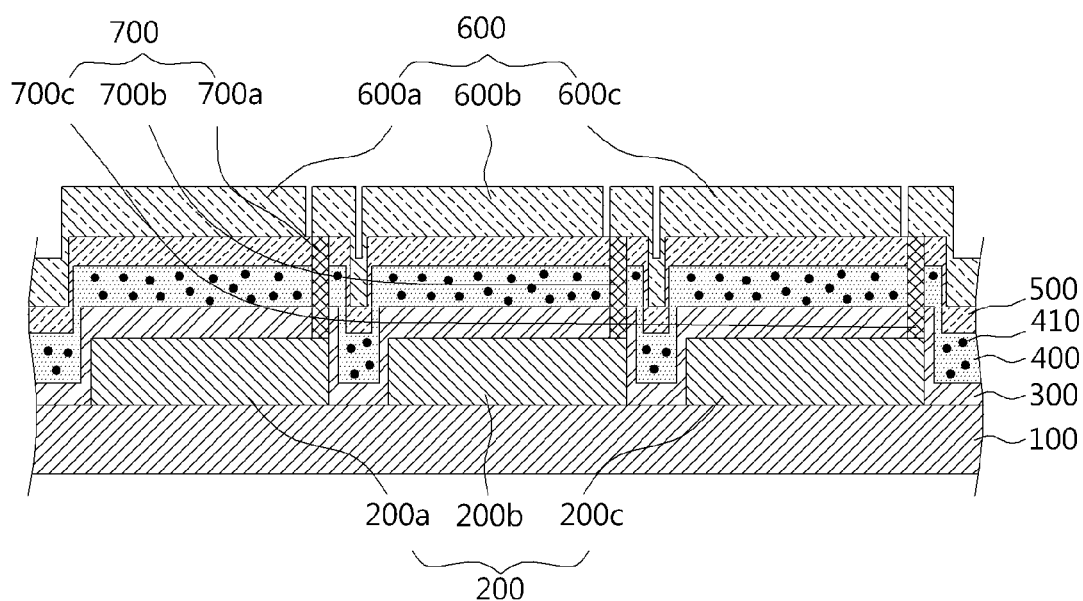

FIGS. 3 to 5 are cross-sectional views showing the method for manufacturing the solar cell module according to one embodiment of the present disclosure, in accordance with process steps.

Referring to FIG. 3, a plurality of first electrodes 200, constituting individual solar cells disposed apart from each other on a substrate 100, is formed.

A second electrode 600 may be formed using various methods, such as a thermal vapor deposition, a sputtering method, a printing technique, and the like, with a metal ink or a conductive material.

For example, a plurality of first electrodes 200 may be formed by applying ITO entirely over a substrate 100 using a sputtering method, and etching it at a constant distance.

Subsequently, a first charge transport layer 300, a photoactive layer 400 and a second charge transport layer 500 are formed entirely over the substrate 100 on which a plurality of the first electrodes 200 are formed. If desired, the first charge transport layer 300 or the second charge transport layer 500 may be omitted.

The first charge transport layer 300 and the second charge transport layer 500 may be formed by performing a solution process appropriately selected from a slot-die printing, a screen printing, an ink-jet printing, a gravure printing, an offset printing, and the like, if desired.

In addition, the photoactive layer 400 may be formed by performing a coating or printing process appropriately selected from a slot-die printing, a screen printing, an ink-jet printing, a gravure printing, an offset printing, a doctor blade coating, a knife edge coating, a dip coating, a spray coating, and the like, if desired, or by performing a vapor deposition process.

Therefore, since the formation of the first charge transport layer 300, the photoactive layer 400 and the second charge transport layer 500 does not require a separate patterning process, there is an advantage in that the process may be simplified.

In addition, the number of patterns can be reduced to minimize the inactive area which is needed for the patterns.

On the other hand, the photoactive layer 400 may further include nanostructures 410. The nanostructures 410 may include metal nanoparticles, metal nanowires, CNTs or graphene. For example, the photoactive layer 400 may further include silver nanoparticles.

Since nanostructures are further included in the photoactive layer 400, the formation of a conductive channel 700 may be induced more efficiently. Moreover, the problem of device destruction phenomenon which may occur at the time of applying a strong electric field in order to form the conductive channel 700 may be minimized.

Subsequently, a plurality of solar cells is obtained by forming a plurality of second electrodes 600, disposed apart from each other, on the photoactive layer 400.

The second electrodes 600 may be formed by various methods, such as a thermal vapor deposition, a sputtering method, a printing technique, or the like, using a metal ink or a conductive material.

For example, a plurality of the second electrodes 600 may be formed by a thermal vapor deposition of Al on the photoactive layer 400 through a metal mask.

At this time, at least a portion of a second electrode 600 may be formed so as to be located on a first electrode 200 of a neighboring solar cell.

Therefore, as shown in FIG. 3, the part in which at least a portion of a second electrode 600b is overlapping with a first electrode 200a of a neighboring solar cell.

Referring to FIGS. 4 and 5, an electric field is applied to a second electrode 600 and a first electrode 200 of a neighboring solar cell to form a conductive channel 700. For example, a programmed voltage or a predetermined high voltage may be applied between the second electrode and the first electrode of the neighboring solar cell to form a conductive channel.

This may be illustrated by the fact that, when a reverse bias is applied to counter electrodes each of which is in a separate neighboring solar cell to exceed a predetermined voltage, a conductive filament is formed inside an organic material. This is a principle similar to dielectric breakdown phenomenon. Therefore, thus-formed conductive filament may be illustrated as a conductive channel.

For example, as shown in FIG. 5, a conducting channel 700 may be formed in a first charge transport layer 300, a photoactive layer 400 and a second charge transport layer 500, which are located between a second electrode 600 and a first electrode 200 of a neighboring solar cell.

Thus, using the electrical work-up, solar cells may be serially connected with one another, without performing a patterning process for the first charge transport layer 300, the photoactive layer 400 and the second charge transport layer 500.

Moreover, the area for serial connection between solar cells may be minimized by reducing the number of patterns, resulting in the minimization of the inactive area of a solar cell module. Consequently, the efficiency of the solar cell module may be improved by increasing the geometric fill factor of the solar cell module.

Preparative Example 1

A sample of the solar cell module according to one embodiment of the present disclosure was prepared.

First, an ITO electrode was applied entirely over a glass substrate by using a sputter and patterned by etching at a constant distance to form three first electrodes, disposed apart from each other, and, then, PEDOT:PSS was spin-coated on the glass substrate, on which the first electrodes were located, to form a first charge transport layer entirely over the glass substrate.

Then, PTB:PC$_{70}$BM, which is a mixture of a conjugated polymer as an electron donor and PC$_{70}$BM as an electron acceptor, was spin-coated on the first charge transport layer to form a photoactive layer entirely over the first charge transport layer.

Subsequently, an aluminum electrode was patterned on the photoactive layer by a thermal vapor deposition, using a metal mask, to form three second electrodes, disposed apart from each other, to obtain three solar cells. Here, the second electrodes were disposed such that at least a portion of a second electrode was located on a photoactive layer of a neighboring solar cell.

Thus-manufactured solar cell module had a structure that the first charge transport layer and the photoactive layer were located between the ITO electrode and the aluminum electrode in the connective area in which counter electrodes each of which is in a separate solar cell were overlapping with each other.

Next, an electric field was applied by connecting positive (+) voltage to an aluminum electrode of one solar cell and connecting negative (−) voltage to an ITO electrode of a solar cell, neighboring to the one solar cell, to form a conductive channel between the aluminum electrode and the ITO electrode through dielectric breakdown phenomenon.

That is, an electric field was applied by connecting counter electrodes each of which is in a separate neighboring solar cell to form a conductive channel to obtain a serial connection between solar cells.

Experimental Example 1

The current-voltage curve of the solar cell module prepared in Preparative Example 1 was analyzed.

Figure 6:
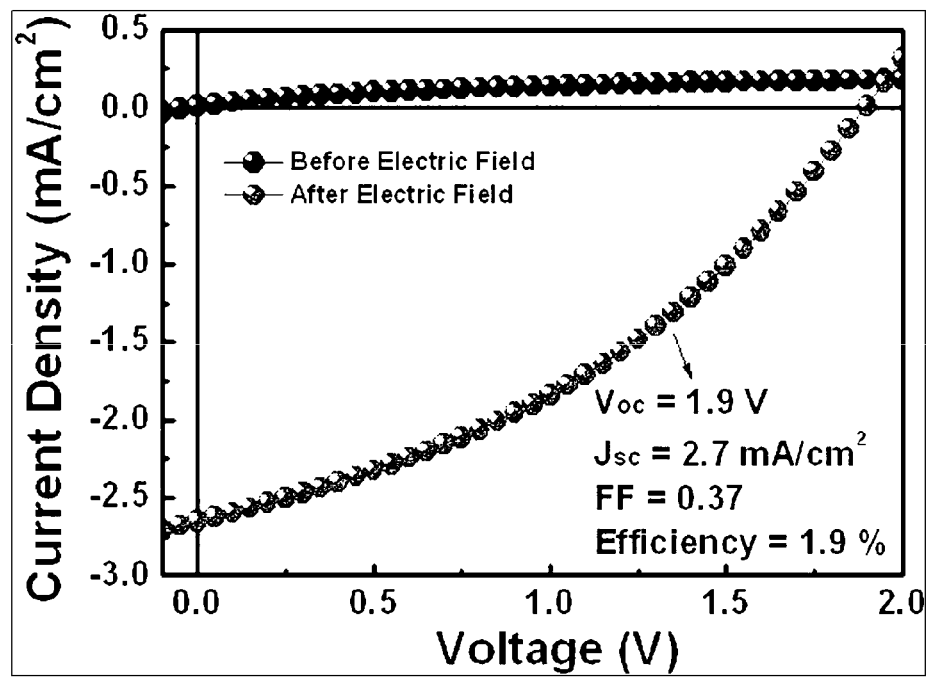
FIG. 6 is a graph showing the current-voltage curve of the solar cell module according to Preparative Example 1 of the present disclosure.

FIG. 6 is a graph showing the current-voltage curve of the solar cell module according to Preparative Example 1 of the present disclosure.

Referring to FIG. 6, the open circuit voltage ($V_{oc}$) is 1.9 V and the short circuit current density ($J_{sc}$) is 2.7 mA/cm$^2$. Further, the FF (Fill Factor) is 0.37 and the photoconversion efficiency is 1.9%.

Thus, since the photoactive material had the $V_{oc}$ of 0.63 V in single solar cell and three solar cells were connected in series, it can be seen that the total $V_{oc}$ is 1.9 V. Therefore, it may be found that the serial connection between the solar cells was effectively made.

Preparative Example 2

A sample of the solar cell module according to one embodiment of the present disclosure was prepared.

The solar cell module was prepared in the same manner as Preparative Example 1, except that a small amount of nanoparticles was added in the photoactive layer and a TiO$_x$ layer was formed as a second charge transport layer on the photoactive layer.

Experimental Example 2

The current-voltage curve of the solar cell module prepared in Preparative Example 2 was analyzed.

Figure 7:
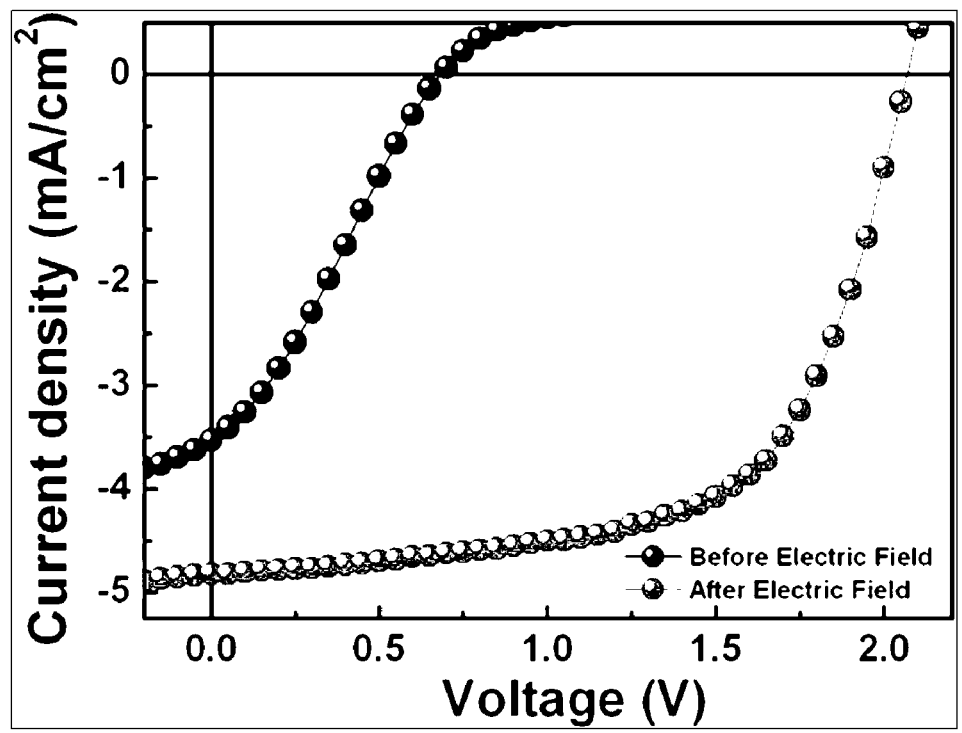
FIG. 7 is a graph showing the current-voltage curve of the solar cell module according to Preparative Example 2 of the present disclosure.

FIG. 7 is a graph showing the current-voltage curve of the solar cell module according to Preparative Example 2 of the present disclosure.

TABLE 1

|  | $V_{oc}$ (V) | $J_{sc}$ (mA/cm$^2$) | FF | $\eta_A$ (%) | $\eta_M$ (%) |
|---|---|---|---|---|---|
| Before electric field | 0.68 | 3.53 | 0.29 | 0.70 | 0.63 |
| After electric field | 2.07 | 4.82 | 0.62 | 6.19 | 5.57 |

Table 1 is a table in which the current-voltage curve of the solar cell module prepared according to Preparative Example 2 was analyzed.

Referring to FIG. 7 and Table 1, the $\eta_A$ denotes the efficiency that only the active area is considered, and the $\eta_M$ denotes the efficiency of the solar cell module according to the formula (active area/total area)*$\eta_A$.

Thus, it may be understood that the solar cell module finally obtained by forming a conductive channel with the application of an electric field had a high photoconversion efficiency of 5.57%.

Therefore, it may be seen that a conductive channel was more efficiently induced by adding silver nanoparticles into a photoactive layer to achieve the serial connection.

As mentioned above, the solar cell module according to the present disclosure does not require any pattern process of layers other than electrodes, and, thus, the number of patterns may be reduced to minimize the inactive area needed for the patterns, resulting in the increase of the geometric fill factor and the increase of the efficiency of the solar cell module.

Although exemplary embodiments have been described in the detailed description and the accompanying drawings, these are merely used for the purpose of easily describing the present disclosure but not used for limiting the scope of the present disclosure. It is obvious to those skilled in the art to which the present disclosure pertains that various modifications may be made without departing from the scope of the present disclosure, in addition to the exemplary embodiments disclosed herein.

DESCRIPTION OF REFERENCE NUMERALS

100: Substrate
200, 200a, 200b, 200c: First electrode
300: First charge transport layer
400: Photoactive layer
410: Nanostructures
500: Second charge transport layer
600, 600a, 600b, 600c: Second electrode
700, 700a, 700b, 700c: Conductive channel

The invention claimed is:

1. A solar cell module comprising:
a substrate;
a first solar cell and a second solar cell over the substrate, each of the first solar cell and the second solar cell comprising:
a first electrode over the substrate, the first electrode of the first solar cell being separated from the first electrode of the second solar cell by a space between the first electrode of the first solar cell and the first electrode of the second solar cell;
a photoactive layer over the first electrode, wherein the photoactive layer is located in the space between the first electrode of the first solar cell and the first electrode of the second solar cell, and the photoactive layer is over an entirety of the substrate over which the first electrode of the first solar cell and the first electrode of the second solar cell are located; and a second electrode over the photoactive layer, wherein at least a portion of the second electrode of the first solar cell is over the first electrode of the second solar cell; and a conductive channel located between the second electrode of the first solar cell and the first electrode of the second solar cell, wherein the photoactive layer comprises nanostructures to induce the formation of the conductive channel between the second electrode of the first solar cell and the first electrode of the second solar cell when an electric field is applied.

2. The solar cell module according to claim 1, wherein the conductive channel is in contact with a portion of the photoactive layer between the second electrode of the first solar cell and the first electrode of the second solar cell.

3. The solar cell module according to claim 1, wherein the conductive channel is formed by applying an electric field across the second electrode and the first electrode of the second solar cell.

4. The solar cell module according to claim 1, wherein the photoactive layer comprises a bulk heterojunction structure of electron donor materials and electron acceptor materials.

5. The solar cell module cording to claim 1, wherein the nanostructures comprise metal nanoparticles, metal nanowires, CNTs or graphene.

6. The solar cell module according to claim 1, wherein one or more of the first solar cell or the second solar cell further comprises a first charge transport layer between the first electrode and the photoactive layer.

7. The solar cell module according to claim 6, wherein one or more of the first solar cell or the second solar cell further comprises a second charge transport layer between the photoactive layer and the second electrode.

8. The solar cell module according to claim 1, wherein one or more of the first solar cell or the second solar cell is a stacked solar cell in which a plurality of photoactive layers is stacked on one another.

9. A method for manufacturing a solar cell module, comprising:

forming a first solar cell and a second solar cell, wherein forming the first solar cell and the second solar cell, comprises:

forming a first electrode of the first solar cell over a substrate, forming a first electrode of the second solar cell over the substrate, the first electrode of the first solar cell and the first electrode of the second solar cell being formed such that the first electrode of the first solar cell is separated from the first electrode of the second solar cell by a space between the first electrode of the first solar cell and the first electrode of the second solar cell;

forming a photoactive layer over the first electrode of the first solar cell, over the substrate, and in the space between the first electrode of the first solar cell and the first electrode of the second solar cell, and the photoactive layer is over an entirety of the substrate over which the first electrode of the first solar cell and the first electrode of the second solar cell are located;

forming a second electrode of the first solar cell over the photoactive layer; and forming a second electrode of the second solar cell over the photoactive layer, the second electrode of the first solar cell and the second electrode of the second solar cell being formed such that the second electrode of the first solar cell is separated from the second electrode of the second solar cell over the substrate, and at least a portion of the second electrode of the first solar cell is over the first electrode of the second solar cell; and forming a conductive channel coupling the portion of the second electrode of the first solar cell and the first electrode of the second solar cell by applying an electric field across the second electrode of the first solar cell and the first electrode of the second solar cell, wherein forming the photoactive layer further comprises adding nanostructures to the photoactive layer to induce the formation of the conductive channel between the second electrode of the first solar cell and the first electrode of the second solar cell when an electric field is applied.

10. The method according to claim 9, wherein the conductive channel is formed in contact with a portion of photoactive layer between the second electrode of the first solar cell and the first electrode of the second solar cell.

11. The method according to claim 9, wherein adding the nanostructures comprises adding metal nanoparticles, metal nanowires, CNTs or graphene.

* * * * *